United States Patent
Loopstra et al.

(10) Patent No.: US 7,110,086 B2
(45) Date of Patent: Sep. 19, 2006

(54) MOVABLE STAGE SYSTEM, LITHOGRAPHIC APPARATUS, AND DEVICE MANUFACTURING METHOD

(75) Inventors: Erik Roelof Loopstra, Heeze (NL); Robert-Han Munnig Schmidt, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 125 days.

(21) Appl. No.: 10/864,805

(22) Filed: Jun. 10, 2004

(65) Prior Publication Data

US 2005/0099616 A1    May 12, 2005

(30) Foreign Application Priority Data

Jun. 11, 2003    (EP)    .................... 03076811

(51) Int. Cl.
*G03B 27/42* (2006.01)
*G03B 27/58* (2006.01)
*H02K 41/00* (2006.01)

(52) U.S. Cl. .............. 355/53; 355/72; 310/12
(58) Field of Classification Search ............ 355/53, 355/72, 75; 378/34; 310/10, 12; 318/64
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 5,969,441 A | 10/1999 | Loopstra et al. | |
| 6,046,792 A | 4/2000 | Van Der Werf et al. | |
| 6,408,045 B1* | 6/2002 | Matsui et al. | 378/34 |

FOREIGN PATENT DOCUMENTS

| | | |
|---|---|---|
| EP | 0 917 004 | 5/1999 |
| WO | WO 98/33096 | 7/1998 |
| WO | WO 98/38597 | 9/1998 |
| WO | WO 98/40791 | 9/1998 |

OTHER PUBLICATIONS

Uchida et al., "A Vertical X-Y Stage for X-Ray Lithography Using SOR," *Bulletin of the Japan Society of Precision Engineering*, vol. 22, No. 2, Jun. 1998, pp. 102-108, XP-000892597.

* cited by examiner

*Primary Examiner*—Alan Mathews
(74) *Attorney, Agent, or Firm*—Pillsbury Winthrop Shaw Pittman LLP

(57) ABSTRACT

A movable stage system capable of operating in a lithographic apparatus, is presented. The movable stage system includes a base, a platform that is movable relative to the base, a balance mass that is movable relative to the base and is configured to compensate for forces generated by a movement of the platform, and a drive mechanism configured to move the platform and the balance mass relative to the base. The drive mechanism comprises at least one belt transmission that couples the platform and the balance mass such that when the platform moves along a direction, the balance mass is moved in an at least partially opposite direction, and a driving device configured to mechanically engage the balance mass or the platform to directly drive the platform or the balance mass.

17 Claims, 5 Drawing Sheets

MOVABLE STAGE SYSTEM, LITHOGRAPHIC APPARATUS, AND DEVICE MANUFACTURING METHOD

PRIORITY INFORMATION

This application claims priority from European Patent Application No. 03076811.3, filed Jun. 11, 2003, herein incorporated by reference in its entirety.

BACKGROUND OF THE INVENTION

1. Field of the Invention

The present invention relates to a movable stage system and associated lithographic apparatus and device manufacturing method.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to a device that can be used to impart an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

- a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table/holder/holder, which ensures that the mask can be held at a desired position in the incoming radiation beam, and that it can be moved relative to the beam if so desired;
- a programmable mirror array: one example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required; and
- a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table/holder/holder; however, the general principles discussed in such instances should be seen in the broader context of the patterning device as set forth here above.

In general, a single wafer will contain a whole network of adjacent target portions that are successively irradiated via the projection system, one at a time. In current apparatus, employing patterning by a mask on a mask table/holder/holder, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table/holder parallel or anti-parallel to this direction. Since, in general, the projection system will have a magnification factor M (generally <1), the speed V at which the substrate table/holder is scanned will be a factor M times that at which the mask table/holder/holder is scanned. More information with regard to lithographic devices as here described can be gleaned, for example, from U.S. Pat. No. 6,046,792, incorporated herein by reference.

In a manufacturing process using a lithographic apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate table/holders (and/or two or more mask table/holders). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

It will be appreciated that, in a lithographic apparatus, the pattern should be projected onto the substrate with a high accuracy. Typically, current state of the art lithographic apparatuses are used to manufacture devices with dimensions in the sub-micron range, so that the pattern should be projected with corresponding accuracy. Therefore, disturbances of, for example, the position of the mask or the substrate have to be prevented. One cause of such disturbances are movements of, for example, the mask table/holder/holder or the substrate table/holder/holder. Such movements give rise to acceleration forces which in turn cause reaction forces in the machine frame of the lithographic apparatus and other parts thereof.

It is generally known to use a balance mass object to reduce the reaction forces. Such a balance mass object is moved in a direction opposite to the movement of the mask table/holder or substrate table/holder. The movement of the balance mass induces its own reaction force, which is opposite to the reaction force caused by the respective table. The reaction forces caused by the balance mass object and the respective table, thus, cancel each other out and the disturbances are reduced.

A sled system is known for providing a rectilinear and synchronous motion of a wafer and mask stage assembly, see, for example, Thomas W. Novak, "A new VLSI printer", *SPIE Vol. 135 Developments In Semiconductor Micro Lithography*, p. 36. The system comprises a sled on which a wafer stage and mask stage are mounted. The sled is positioned on top of a block of granite and movable by means of air bearings with respect to the block. The movement of the sled is driven by means of a belt transmission comprising two endless belts, each mounted around two pulleys positioned at a distance from each other. One of the pulleys is driven by a servomotor, which drives the endless belts to thereby move the sled. Two counterweights with a total mass equal to the mass of the sled are connected to the belts such that they move in a direction opposite to the movement of the sled. The momentum of the sled is thereby counteracted and reaction forces are compensated.

SUMMARY OF THE INVENTION

A disadvantage of the prior art sled system noted above is that the movement of the sled and counterweights follow the operation of the servomotor with a delay. For example, the movement does not start or stop at the same instant the servomotor starts or stops. This is due, inter alia, to the delay caused by the pulleys and endless belts. Hence, the control over the movement and positioning of the sled is not accurate.

The principles of the present invention, as embodied and broadly described herein, provide an improved movable stage system having more accurate control of the movements. In one embodiment, a movable stage comprises a base; a platform that is movable relative to the base; a balance mass object that is movable relative to the base and is configured to compensate for forces generated by a movement of the platform; and a drive mechanism configured to move the platform and the balance mass object relative to the base. The drive mechanism comprises at least one belt transmission that couples the platform and the balance mass object such that when the platform moves in one direction, the balance mass object is moved in an at least partially opposite direction; and a driving device configured to mechanically engage the balance mass object or the platform to directly driving the platform or the balance mass object.

The movements are controlled more accurately because the driving device engages on at least the balance mass object or the platform. The platform may for example comprises a mask table/holder or a substrate table/holder Thus, the driving device directly controls the movement of the balance mass object and/or the platform. The movement of the balance mass object and/or the platform therefore follows the operation of the driving device without delay caused by the belt transmission.

In another embodiment, the invention provides a lithographic apparatus, which comprises a radiation system configured to condition a beam of radiation; a support structure configured to support a patterning device that imparts a desired pattern to the beam of radiation; a substrate holder configured to hold a substrate; a projection system configured to project the patterned beam onto a target portion of the substrate; a projection system for projecting the patterned beam onto a target portion of the substrate; and a positioning apparatus that positions at least a first part of the apparatus relative to other parts of the apparatus. The positioning apparatus includes a movable stage system comprising a base; a platform that is movable relative to the base; a balance mass object that is movable relative to the base and is configured to compensate for forces generated by a movement of the platform; and a drive mechanism configured to move the platform and the balance mass object relative to the base. In turn, the drive mechanism comprises at least one belt transmission that couples the platform and the balance mass object such that when the platform moves along a direction, the balance mass object is moved in an at least partially opposite direction; and a driving device configured to mechanically engage the balance mass object or the platform to directly drive the platform or the balance mass object.

The movements of components can be controlled accurately because the driving device engages on at least the balance mass object or the platform. Thus, the driving device directly controls the movement of the balance mass object and/or the platform. The movement of the balance mass object and/or the platform therefore follows the operation of the driving device without delay caused by the belt transmission.

In another embodiment, a device manufacturing method is presented. The device manufacturing method comprises providing a substrate that is at least partially covered by a layer of radiation-sensitive material; conditioning a beam of radiation using a radiation system; providing a support configured to support a patterning device; configuring the beam of radiation with a desired pattern in its cross-section based on the patterning device; projecting the patterned beam of radiation onto a target area of the layer of radiation-sensitive material; and positioning at least a first part of the apparatus relative to other parts of the apparatus via a positioning apparatus. The positioning apparatus includes a movable stage system comprising a base, a platform that is movable relative to the base; a balance mass object that is movable relative to the base and is configured to compensate for forces generated by a movement of the platform; and a drive mechanism configured to move the platform and the balance mass object relative to the base. The drive mechanism comprises at least one belt transmission that couples the platform and the balance mass object such that when the platform moves along a direction, the balance mass object is moved in an at least partially opposite direction; and a driving device configured to mechanically engage the balance mass object or the platform to directly drive the platform or the balance mass object.

Is such a device manufacturing method, components are positioned more accurately because a movable stage system according to the invention is used.

BRIEF DESCRIPTION OF DRAWINGS

Embodiments of the invention will now be described, by way of example only, with reference to the accompanying schematic drawings in which:

FIG. 8b schematically shows a cross-sectional view of the example of FIG. 8a along the line B—B in FIG. 8a.

DETAILED DESCRIPTION OF THE INVENTION

Figure 1:
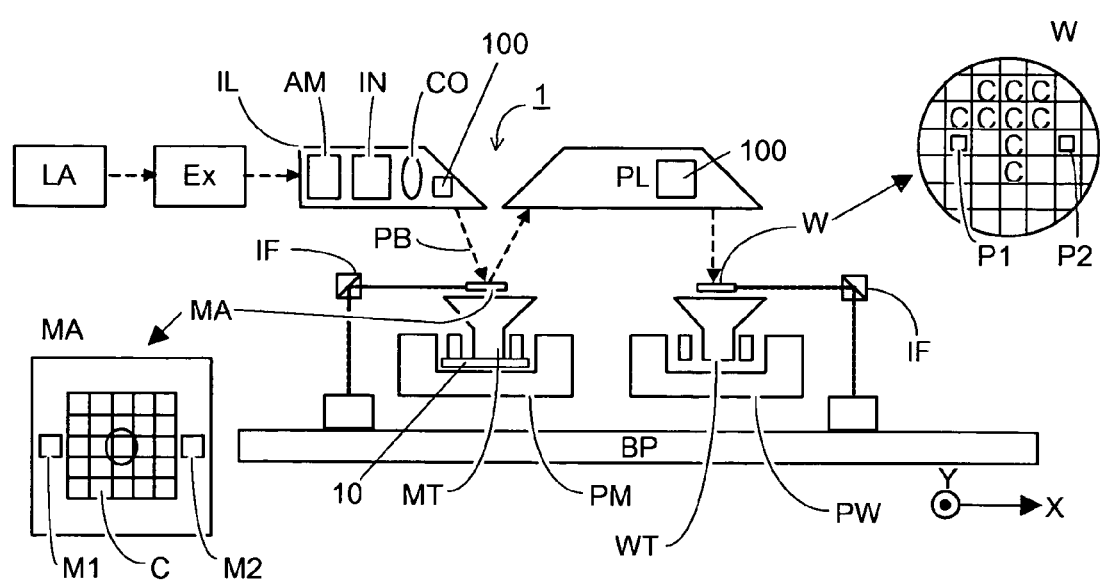
FIG. 1 schematically shows an example of an embodiment of a lithographic projection apparatus according to the invention.

FIG. 1 schematically depicts a lithographic projection apparatus according to an embodiment of the invention. The apparatus comprises:

an radiation system Ex, IL: for supplying a projection beam PB of radiation (e.g. EUV, DUV, or UV radiation). In this particular case, the radiation system also comprises a radiation source LA;

a first object table (mask table/holder/holder) MT: provided with a mask holder for holding a mask MA (e.g. a reticle), and connected to first positioning mechanism for accurately positioning the mask with respect to item PL;

a second object table (substrate table/holder) WT: provided with a substrate holder for holding a substrate W (e.g. a resist-coated silicon wafer), and connected to second positioning mechanism for accurately positioning the substrate with respect to item PL;

a projection system ("lens") PL: for example, a mirror or refractive lens system that images an irradiated portion of the mask MA onto a target portion C (comprising one or more dies) of the substrate W.

The apparatus may be of a reflective type, for example, having a reflective mask, or may be of a transmissive type, for example, having a transmissive mask. Alternatively, the apparatus may employ another kind of patterning device, such as a programmable mirror array of a type as referred to above.

The source LA (e.g. a Hg lamp, an excimer laser, an undulator or wiggler provided around the path of an electron beam in a storage ring or synchrotron, a laser-produced plasma source or otherwise) produces a beam of radiation. This beam is fed into an radiation system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1, that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table/holder MT. Having been selectively reflected by the mask MA, the beam PB passes through the projection system PL, which focuses the beam PB onto a target portion C of the substrate W. With the aid of the second positioning mechanism PW (and interferometric measuring mechanism IF), the substrate table/holder WT can be moved accurately, e.g. so as to position different target portions C in the path of the beam PB.

Similarly, the first positioning mechanism PM can be used to accurately position the mask MA with respect to the path of the beam PB, e.g. after mechanical retrieval of the mask MA from a mask library, or during a scan. Depending on the source LA that is used, the mask table/holder MT, the projection system PL and the substrate table/holder WT may be enclosed by a vacuum chamber.

In general, movement of the object tables MT, WT will be realized with the aid of a long-stroke module (coarse positioning) and a short-stroke module (fine positioning), which are not explicitly depicted in FIG. 1. As an example, the first positioning mechanism may comprise of a first positioning device, e.g. a linear motor system, for displacing the mask MA over comparatively large strokes (coarse positioning), while a second position device, e.g. a second linear motor system, comprising of a plurality of actuators and mounted on the first linear motor allows an accurate positioning of the mask MA in six degrees of freedom over comparatively small strokes (fine positioning). However, in the case of a wafer stepper (as opposed to a step-and-scan apparatus) the mask table/holder MT may just be connected to a short stroke actuator, or may be fixed. Mask MA and substrate W may be aligned using mask alignment marks M1, M2 and substrate alignment marks P1, P2.

The apparatus depicted in FIG. 1, can be used in different modes:
  step mode: the mask table MT is kept essentially stationary, and an entire mask image is projected in one go (i.e. a single "flash") onto a target portion C. The substrate table WT is then shifted in the X and/or Y directions so that a different target portion C can be irradiated by the beam PB;
  scan mode; essentially the same scenario applies, except that a given target portion C is not exposed in a single "flash". Instead, the mask table MT is movable in a given direction (the so-called "scan direction", e.g. the Y-direction) with a speed v, so that the projection beam PB is caused to scan over a mask image; concurrently, the substrate table WT is simultaneously moved in the same or opposite direction at a speed V=M v, in which M is the magnification of the lens PL (typically, M=¼ or ⅕). In this manner, a relatively large target portion C can be exposed, without having to compromise on resolution; and
  other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

In the exemplary lithographic apparatus of FIG. 1, the mask table/holder MT is mounted on a movable stage system 10 according to the invention. The stage 10 is assumed to be implemented according to the example shown in FIGS. 2–4. However, it is possible to implement the stage differently, for example, in accordance with the examples shown in FIGS. 5, 6 and 8. Other parts of the lithographic projection apparatus may likewise be provided with a movable stage system, such as the wafer table WT for example.

Figure 2:
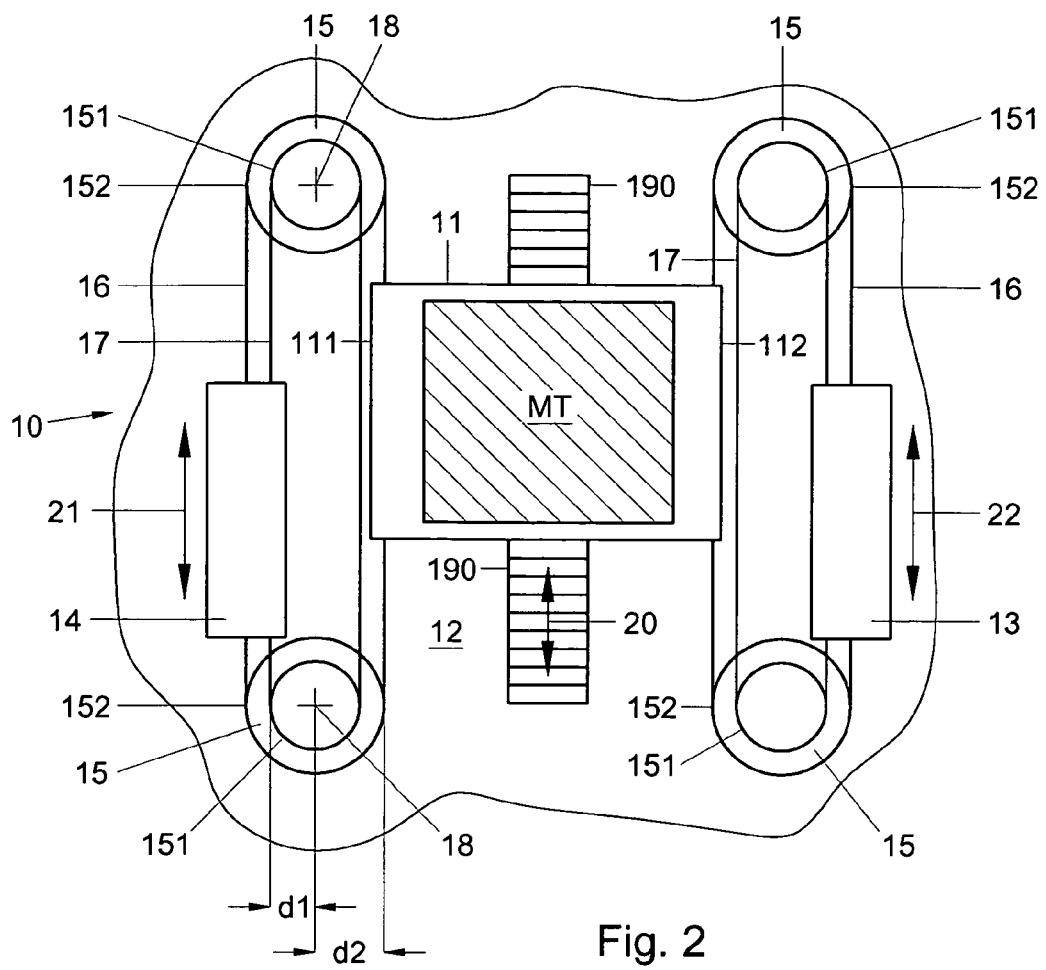
FIG. 2 schematically shows a top view of a first example of an embodiment of a movable stage system according to the invention.
Figure 3:
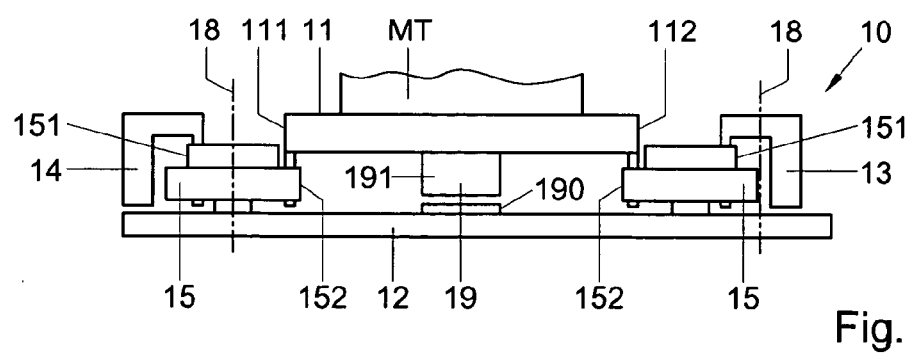
FIG. 3 schematically shows a side view of the example of FIG. 2.
Figure 4:
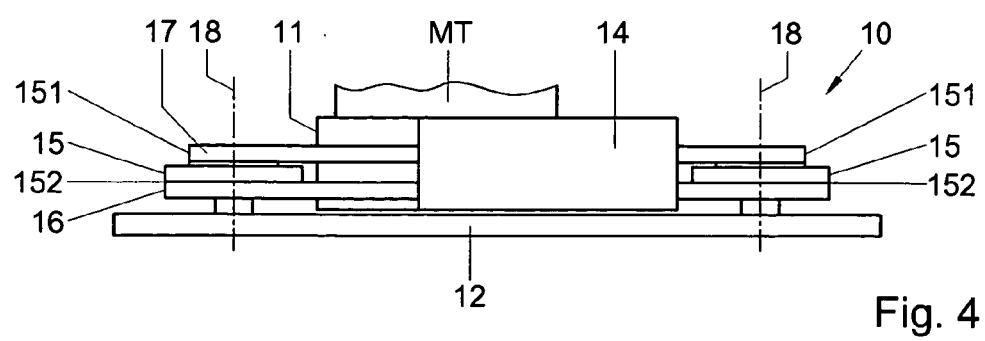
FIG. 4 schematically shows a side view of the example of FIG. 2.

As shown in FIGS. 2–4, in accordance with embodiments of the present invention, the movable stage system 10 comprises a base 12 and a platform 11 on which the mask table/holder MT is positioned. The platform 11 is movable with respect to the base 12 along the surface of the base 12 in a direction parallel to the surface, as indicated by arrow 20. In the example of FIGS. 2–4, the platform is floating above the base 12 on an air bearing (not shown). The movable stage system 10 further comprises balance mass objects 13,14. The balance mass objects 13,14 are positioned on opposite sides 111,112 of the platform 11. The balance mass objects 13,14 are movable in a direction opposite to the direction in which the platform is moved, as indicated by arrows 21,22 in FIG. 2.

A movement of the platform 11 with respect to the base 12 causes a reaction force on the base 12, as well as other parts of the system, and gives rise to a momentum. The motion of the balance mass objects 13,14 in the direction opposite to the movement of the platform 11 compensates for this reaction force. As such, almost no force is exerted on the base 12 and substantially no momentum is present when the platform 11 is moved.

The movement of the balance mass objects 13,14 is coupled to the movement of the platform 11 via two belt transmissions. The belt transmissions each comprise two rotatable members 15, which may be pulleys for example, at a distance from each other. The rotatable members 15 serve as guides for belt 16 and are each rotatable around an imaginary rotation axis 18, as shown by dashed lines in FIGS. 3 and 4.

In each belt transmission, a first endless-belt 16 is guided along a first circumferential surface 152 of the rotatable members 15 and a second endless-belt 17 is guided along a second, receded, circumferential surface 151 which is receded with respect to the first circumferential surface 152 towards the rotation axis 18. In this example, each of the endless-belts 16,17 is composed of a single, integral belt shaped part with its ends connected to each other, but it is likewise possible to use an endless-belt which comprises two or more parts, such as, for example, a belt with its ends connected to each other via a spring or otherwise or use other types of belts mounted movably on the rotatable members. It will be appreciated that the term "belt" may include chain belts, toothed belts, or any other type of belt-shaped structures.

In the movable stage system, no separate drive mechanisms are required to drive the balance mass objects because the belt transmissions couple the movements of the platform 11 and the balance mass objects 13,14. Hence the movable stage system 10 is of a simple design and the compensation of forces is achieved in a relatively mechanically uncomplicated manner.

A driving device, for example, linear motor 19 (which will be discussed in more detail below), is mounted between the platform 11 and the base 12. The linear motor 19 can exert a force directly on the platform 11, which in this example is a magnetic force. The platform 11 can be moved with respect to the base 12 via this direct force. In the example of FIGS. 2–4, the stroke of the linear motor 19 is equal to the displacement of the platform because the linear motor 19 engages directly on the platform 11 and 12. Hence, the stroke of the linear motor 19 required for a certain displacement of the platform 11 is reduced. Thereby, a lighter motor can be used, allowing a reduction of the overall weight of the movable stage system 10.

In the embodiments depicted in FIGS. 2–4, the second circumferential surface 151 of the rotatable members 15 is receded with respect to the first circumferential surface 152. Seen in a direction perpendicular to the distance between the rotatable members 15 of the belt transmission, the balance mass objects 13,14 lie closer to the rotation axis 18 than the platform 11. The distance between the balance mass object 14 and rotation axis 18 is indicated by arrow d1 in FIG. 2, while the distance between the platform 11 and the rotation axis 18 is indicated by arrow d2.

Because of the difference in distances, the angular moment applied by the balance mass objects 13,14 on the rotatable members 15 is different from the angular moment applied by the platform 11. Hence, the total mass of the balance mass objects 13,14 may differ from the mass of the platform 11 and mask table/holder MF to compensate for this difference and obtain equal moments of force. In the example of FIGS. 2–4 for instance, the overall mass of the balance mass objects 13,14 may be higher than the added mass of the platform 11 and objects mounted thereon to obtain an equal, but opposite, moment of force of the balance mass objects 13,14 and the platform 11.

Figure 7:
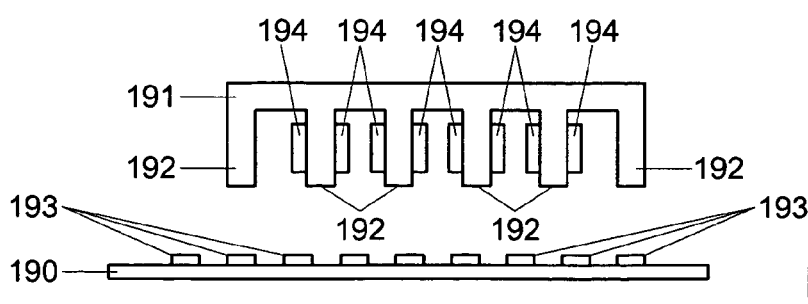
FIG. 7 schematically shows an example of a linear motor suitable for use in the examples of FIGS. 2–6.

As shown in more detail in FIG. 7, the linear motor 19 in the example of FIGS. 2–4 comprises a magnetic plate 190 that includes a number of magnets 193. In the example of FIGS. 2–4, the magnetic plate 190 is attached to the base 12. A magnetic coil block 191 is provided on the platform 11 facing the magnetic plate 190. The magnetic coil block 191 is made of a ferro-magnetic material and is provided with a number of legs 192 pointing towards the magnetic plate 190. Electrical wire is wounded in a circumferential direction around the legs 192 of the core. Thus, multiple magnetic coils 194 are obtained.

By applying a suitable current through the electrical wires, a magnetic field opposite to the magnetic fields of the magnets 193 can be generated by means of the magnetic coils 194. Thereby, a magnetic force can be applied directly to the platform 11 which serves to move platform 11 relative to base 12. Linear motors that apply magnetic forces generally have few moving parts, as seen in the example illustrated in FIG. 7 and, thus, do not induce vibrations. Furthermore, the operation of such a linear motor can be controlled accurately via suitable electronic circuitry. However, other types of driving devices may likewise be used to move the platform 11 with respect to the base 12, such as, for instance, the linear motor shown in FIGS. 8a–b.

Figure 8A:
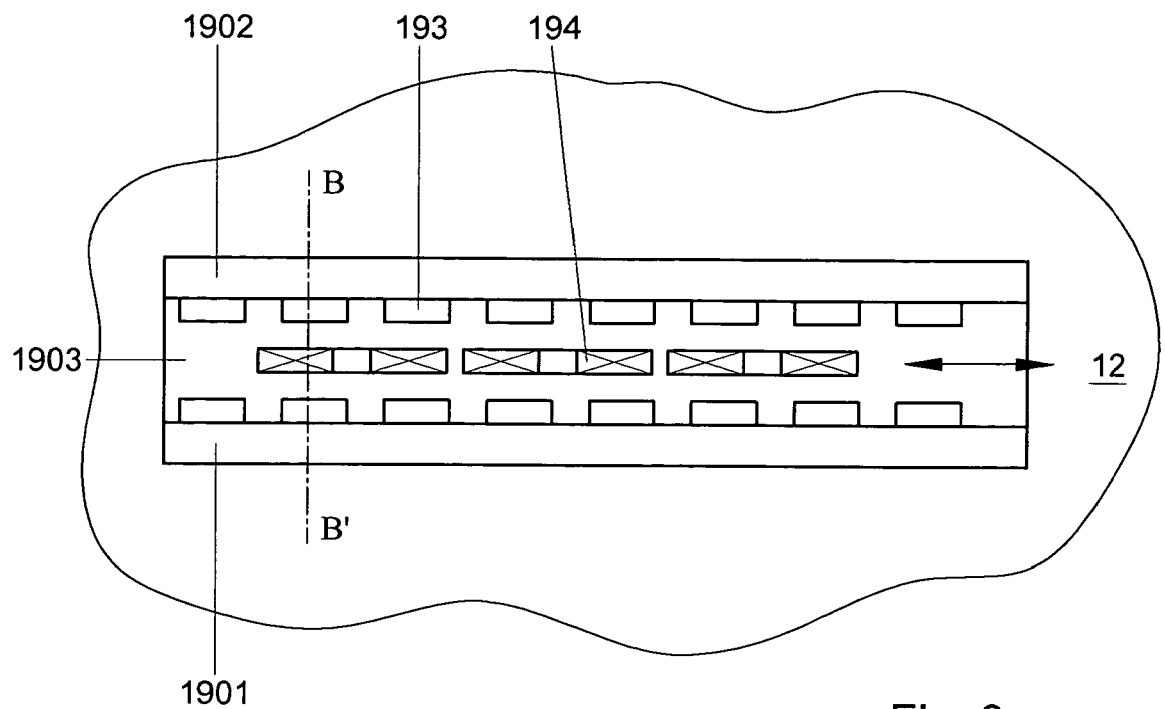
FIG. 8a schematically shows a top view of another example of a linear motor suitable for use in the examples of FIGS. 2–6.
Figure 8B:
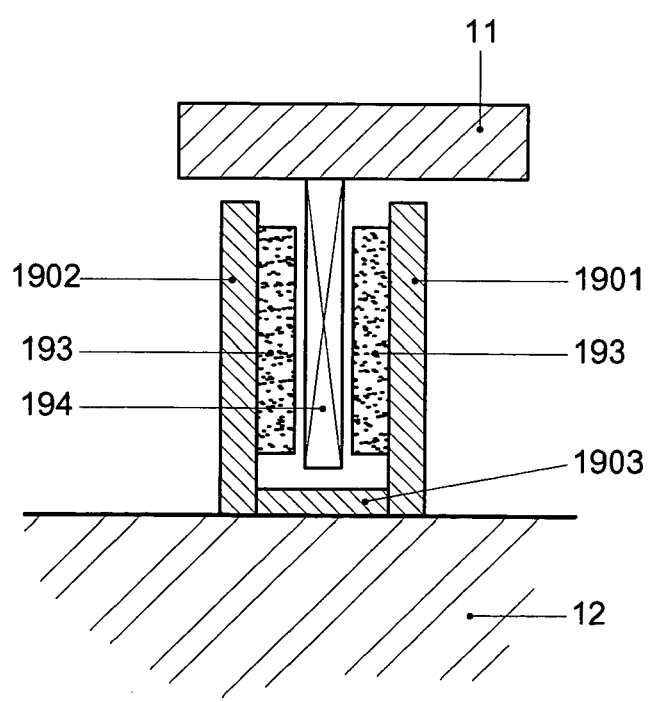

The linear motor of FIGS. 8a–b comprises two magnet plates 1901,1902 positioned at a distance from each other. Both magnet plates form the stationary part of the linear motor and may, as shown, for example be mounted in an upright position on the base 12. As shown in FIG. 8b, the magnet plates 1901–1902 are part of an arrangement with a substantially U-shaped cross-section. The magnet plates 1901–1902 are part of the upright legs of the U-shaped arrangement and the leg 1903 between the upright legs is positioned parallel to the base 12.

A set of magnetic coils 194 is positioned in the spacing between the magnet plates 1901,1902. The magnetic coils 194 may for example be mounted on the platform 11 or the balance mass objects 13,14. The magnetic coils 194 are movable in the spacing between the magnet plates 1901, 1902 (by applying suitable currents through the coils 194) in the direction of the arrow shown in the FIG. 8a. In the linear motor shown in FIG. 8, the part with the magnetic coils 194 is not attracted to the magnet plate because the core does not comprise ferro-magnetic material. In this example, an air bearing may be provided between the magnet plates 1901, 1902 and the magnetic coils 194 to improve a frictionless movement of the magnetic coils 194 relative to the plates.

Figure 5:
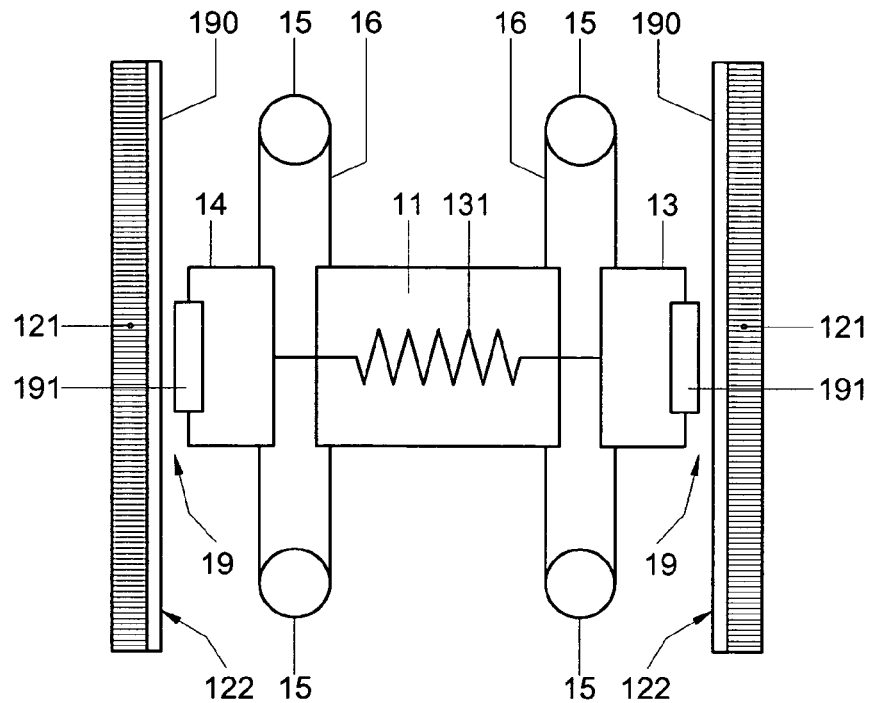
FIG. 5 schematically shows a top view of an second example of an embodiment of a movable stage system according to the invention.

FIG. 5 depicts another embodiment of a movable stage system, in accordance with the present invention. This system comprises two belt transmissions in which each belt transmission has a single endless belt 16 positioned along the circumferential surface of two rotational members 15 positioned at a distance from each other. To each endless belt 16, both a balance mass object 13,14 and the platform 11 are attached. The balance mass 13,14 is connected to a length of the endless belt between the rotatable members 16, while the platform 11 is connected to another length of the endless belt 16 between the rotatable members 16. Thus, the angular moments of the balance mass object 13,14 and the platform 11 applied to the rotatable members 15 are the same.

In the embodiment illustrated in FIG. 5, linear motor 19 is provided between each of the balance mass objects 13,14 and the base 12. The linear motors 19 may, for example, be implemented as in the example of FIG. 7. The linear motor directly drives the movement of the balance mass objects 13,14 and the displacement of the balance mass objects 13,14 is equal but opposite to the displacements of the platform 11. The stroke of each of the linear motors 19 is equal to the displacement of the balance mass object directly driven by the respective linear motor. Thus, the stroke of each of the linear motors 19 is equal to the displacement of the platform 11 relative to the base 12. Hence, no additional means are required to adjust the stroke of the linear motors 19 to obtain a desired displacement of the platform 11 relative to the base 12.

As indicated in FIG. 5, the base 12 is provided with straight flanges 121 projecting upwards with respect to the surface of the base 12 and extending in parallel to the direction of movement of the balance mass objects. Each of the linear motors 19 is positioned between a side of the balance mass objects which projects with respect to the surface of the base 12 and the respective flange. The magnetic plate 190 is provided at a side 122 of the flange 121 which faces the balances mass objects 13,14 and the magnetic coil block 191 is attached to the balance mass object 13,14.

In addition to a moving force in the direction of movement of the balance mass objects 13,14, the linear motor may be configured to provide a control force in a direction perpendicular to the direction of movement and parallel to the surface of the base 12. Thereby, each linear motor 19 may keep the respective balance mass object 13,14 in position with respect to the base and no additional positioning or guiding devices are required. However, separate positioning or guiding devices may be provided, depending on the specific implementation. In the example of FIG. 5, the balance masses are mechanically coupled to each other via a spring 131. Thereby, because the effective mass of the coupled balance-masses is equal to the added mass of the separate balance mass objects. Thus, the sensitivity of the balance masses to disturbances is reduced, because of the increased inertia of the coupled balance masses. Instead of a spring other types of elastic couplings may likewise be used.

Figure 6:
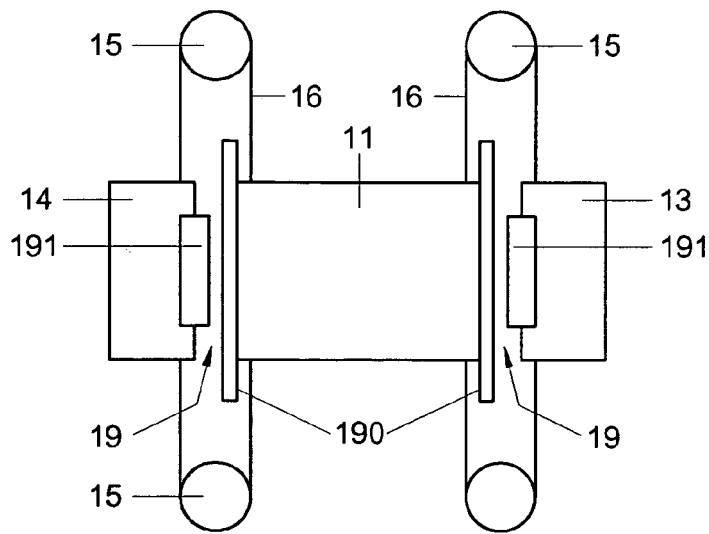
FIG. 6 schematically shows a top view of a third example of an embodiment of a movable stage system according to the invention.

In the embodiment illustrated in FIG. 6, a linear motor 19 is provided between each of the balance masses 13,14 and the platform 11. Thus, the platform 11 can be moved by applying a push or pull force from the platform on the balance masses 13,14 via the linear motor 19. The linear motor 19 is positioned at the sides of the balance mass objects and the platform facing each other and thus not only provides a force in the direction of movement but also in a direction between the balance mass object 13,14 and the platform 11. Thereby, no additional means are required to keep the balance mass objects 13,14 in position with respect to the platform 11, such as for example separate drift motors to prevent uncontrolled movements of the balance mass objects 13,14 with respect to the platform 11.

In the embodiments illustrated in FIGS. 5, 6, the coil blocks 191 of the linear motors 19,19' are provided on the balance mass objects 13,14 and not the platform 11. Thereby, heat generated in the coil blocks 191 during operation is not transferred to the platform 11 and hence thermal expansion of the platform 11 is prevented.

Figure 9:
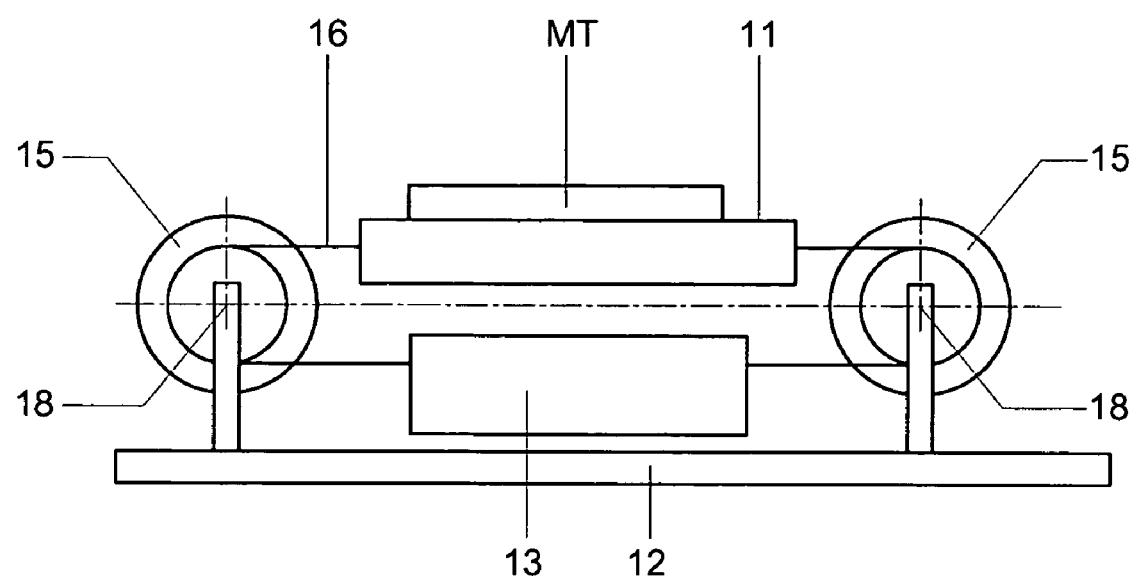
FIG. 9 schematically shows a fourth example of an embodiment of a movable stage system according to the invention.

In the embodiment illustrated in FIG. 9, the balance mass 13 is positioned between the base 12 and the platform 11. The rotatable members 15 are rotatable around an imaginary rotation axis 18 which lies in parallel with the surface of the base 12 on which the platform 11 is positioned. The movable stage system thus has a smaller footprint than that of the embodiments illustrated in FIGS. 2–4. Furthermore, in FIG. 9, the system has a single balance mass object positioned under the platform 11. The embodiment, therefore, has a reduced number of movable components compared to the embodiments of FIGS. 2–6.

In a movable stage system according to the invention, the belt transmission may be of any type suitable for the specific implementation. The belt transmission may for example comprise endless belts of a plate spring type, which in general are very stiff in the longitudinal and thus provide a direct coupling of the displacement of the platform and the displacement of the balance mass.

It should be noted that the above-mentioned embodiments illustrate rather than limit the invention, and that those skilled in the art will be able to design alternatives without departing from the scope of the appended claims. For instance, in the embodiments of FIGS. 2–4, the platform may instead of an air bearing be mounted on a different type bearing. Likewise, a different number of balance mass objects may be provided, for example. Also, instead of rotatable members other guiding means may be used. For instance, a disk shaped element which is fixated with respect to the base may be used which has a sufficiently smooth circumferential surface to slide a belt along.

As such, while specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A horizontally-oriented movable stage system, comprising:
    a base;
    a platform that is movable relative to the base;
    a balance mass that is movable relative to the base and is configured to compensate for forces generated by a movement of the platform; and
    a drive mechanism configured to move the platform and the balance mass relative to the base, the drive mechanism comprising:
        at least one belt transmission that couples the platform and the balance mass such that when the platform moves along a direction, the balance mass is moved in an at least partially opposite direction; and
        a drive configured to mechanically engage the balance mass or the platform to directly drive the platform or the balance mass.

2. The movable stage system of claim 1, wherein the belt transmission comprises:
    a first rotatable member;
    a second rotatable member at a distance from the first rotatable member; and
    at least one belt arranged along the first and second rotatable member.

3. The movable stage system of claim 2, wherein:
    the belt transmission further comprises:
    at least two endless belts of which a first belt engages the platform and a second belt engages the balance mass, and
    the first and second rotatable members each comprise;
        a first circumferential surface in contact with the first belt, and
        a second circumferential surface in contact with the second belt in which the second circumferential surface recedes with respect to the first circumferential surface towards a rotation axis of the rotatable member.

4. The movable stage system of claim 1, wherein the driving device is a linear motor having a magnetic mechanism that exerts a magnetic force on the balance mass or the platform.

5. The movable stage system of claim 1, wherein the driving device is positioned between the balance mass and the platform in order to displace the platform via a force exerted on the balance mass by the platform or a force exerted on the platform by the balance mass.

6. The movable stage system of claim 1, wherein the driving device is positioned between the balance mass or the platform and the base in order to displace the balance mass or the platform by applying a force from the base to the balance mass or the platform or by applying a force from the balance mass or the platform to the base.

7. The movable stage system of claim 1, wherein the balance mass comprises at least two balance mass each positioned at an opposite side of the platform.

8. The movable stage system of claim 2, wherein the first and second rotatable members are each rotatable around a rotation axis perpendicular to a plane in which the platform and balance mass are movable.

9. The movable stage system of claim 2, wherein the first and second rotatable member are each rotatable around a rotation axis parallel to a plane in which the platform and balance mass are movable.

10. The movable stage system of claim 2, wherein the driving device can also position the balance mass or the platform in a direction different from the moving direction.

11. The movable stage system of claim 1, further comprising;
    at least one additional balance mass;

at least one additional drive mechanism, such that each of the drive mechanisms are arranged to move each of the balance mass relative to the base,
wherein the balance mass are elastically coupled to each other.

12. A lithographic apparatus, comprising;
a radiation system configured to condition a beam of radiation;
a support structure configured to support a patterning device that imparts a desired pattern to the beam of radiation;
a substrate holder configured to hold a substrate;
a projection system configured to project the patterned beam onto a target portion of the substrate;
a projection system for projecting the patterned beam onto a target portion of the substrate; and
a horizontally-oriented positioning apparatus configured to position a first part relative to other parts of the apparatus, the positioning apparatus including:
a base;
a platform that is movable relative to the base;
a balance mass tat is movable relative to the base and is configured to compensate for forces generated by a movement of the platform;
a drive mechanism configured, to move the platform and the balance mass relative to the base, the drive mechanism comprising at least one belt transmission that couples the platform and the balance mass such that when the platform moves along a direction, the balance mass is moved in an at least partially opposite direction; and
a drive configured to mechanically engage the balance mass or the platform to directly drive the platform or the balance mass.

13. The lithographic apparatus of claim 12, wherein the first part of the apparatus comprises the support structure.

14. The lithographic apparatus of claim 12, wherein the first part of the apparatus comprises the substrate holder.

15. The lithographic apparatus of claim 12, wherein the positioning apparatus further comprises:
a first positioning apparatus configured to displace the first pan over a long stroke distance; and
a second positioning apparatus, mourned on the first positioning apparatus, configured to displace the first pan over a short stroke distance which is shorter than the large stroke distance in order to accurately position the first part,
wherein each of the first and second positioning apparatuses comprise the movable stage system.

16. A device manufacturing method, comprising:
providing a substrate that is at least partially covered by a layer of radiation-sensitive material;
conditioning a beam of radiation using a radiation system;
providing a support configured to support a patterning device;
configuring the beam of radiation with a desired pattern in its cross-section based on the patterning device;
projecting the patterned bean of radiation onto a target area of the layer of radiation-sensitive material; and
positioning at least a first part of the apparatus relative to other parts of the apparatus via a positioning apparatus, the positioning apparatus including a horizontally-oriented movable stage system comprising:
a base;
a platform that is movable relative to the base;
a balance mass that is movable relative to the base and is configured to compensate for forces generated by a movement of the platform; and
a drive mechanism configured to move the platform and the balance mass relative to the base, die drive mechanism comprising:
at least one belt transmission tat couples the platform and rho balance mass such that when the platform moves along a direction, the balance mass is moved in an at least partially opposite direction; and
a drive configured to mechanically engage the balance mass or the platform to directly drive the platform or the balance mass.

17. A movable stage system, comprising:
a base;
a platform that is movable relative to the base;
a first and second balance mass that are movable relative to the base and are elastically coupled to each other, the first and second balance masses being configured to compensate for forces generated by a movement of the platform; and
a first and second drive mechanism configured to move the first and second balance masses relative 10 the base, each of the drive mechanisms comprising:
at least one belt transmission that couples the platform to an associated balance mass such that when the platform moves along a direction, the associated balance mass moves in an at least partially opposite direction; and
a drive configured to mechanically engage the associated balance mass or the platform to directly drive the platform or the balance mass.

* * * * *